United States Patent
Jeong et al.

(10) Patent No.: US 10,186,567 B2
(45) Date of Patent: Jan. 22, 2019

(54) ORGANIC LIGHT-EMITTING DISPLAY APPARATUS WITH TRANSMISSION AREA

(71) Applicant: SAMSUNG DISPLAY CO., LTD., Yongin-si, Gyeonggi-Do (KR)

(72) Inventors: Cheolyun Jeong, Yongin-si (KR); Sunghoon Kim, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 73 days.

(21) Appl. No.: 14/845,306

(22) Filed: Sep. 4, 2015

(65) Prior Publication Data
US 2016/0111487 A1     Apr. 21, 2016

(30) Foreign Application Priority Data
Oct. 20, 2014    (KR) ........................ 10-2014-0141698

(51) Int. Cl.
     *H01L 27/32*         (2006.01)

(52) U.S. Cl.
     CPC ........ *H01L 27/3279* (2013.01); *H01L 27/326* (2013.01); *H01L 27/3246* (2013.01); *H01L 27/3258* (2013.01)

(58) Field of Classification Search
     CPC .. H01L 27/32; H01L 27/3262; H01L 27/3276
     See application file for complete search history.

(56) References Cited

U.S. PATENT DOCUMENTS

| | | | |
|---|---|---|---|
| 2004/0108978 A1* | 6/2004 | Matsueda | G09G 3/3233 345/76 |
| 2005/0082967 A1 | 4/2005 | Ryu | |
| 2007/0285389 A1 | 12/2007 | Ito | |
| 2011/0175097 A1* | 7/2011 | Song | H01L 27/326 257/59 |
| 2011/0241014 A1 | 10/2011 | Yoon et al. | |
| 2012/0241796 A1* | 9/2012 | Naito | H01L 27/3232 257/98 |
| 2015/0279271 A1* | 10/2015 | Xi | G09G 3/3233 345/211 |
| 2016/0141348 A1* | 5/2016 | Lin | H01L 27/3262 257/40 |

FOREIGN PATENT DOCUMENTS

| | | |
|---|---|---|
| JP | 2002-350809 A | 12/2002 |
| JP | 2007-257164 A | 10/2007 |
| KR | 10-2005-0025509 A | 3/2005 |
| KR | 10-2011-0111104 A | 10/2011 |
| KR | 10-2015-0061738 A | 6/2015 |

* cited by examiner

*Primary Examiner* — Phuc Dang
(74) *Attorney, Agent, or Firm* — Lee & Morse, P.C.

(57) ABSTRACT

A display apparatus has pixel area to emit light, a transmission area to transmit external light, and wirings including scan wiring, data wiring, and power wiring. The data and power wiring are adjacent to the pixel area and transmission area. An organic light-emitting device is in the pixel area. At least one of the data wiring or the power wiring includes first wiring and second wiring. The first wiring is adjacent to the pixel area and including a mother wiring having a first width. The second wiring includes a plurality of branched wirings that branch from the mother wiring. The branched wirings are adjacent to the transmission area, and a width of each of the branched wirings is less than the first width.

23 Claims, 10 Drawing Sheets

US 10,186,567 B2

ORGANIC LIGHT-EMITTING DISPLAY APPARATUS WITH TRANSMISSION AREA

CROSS-REFERENCE TO RELATED APPLICATION

Korean Patent Application No. 10-2014-0141698, filed on Oct. 20, 2014, and entitled, "Organic Light-Emitting Display Apparatus," is incorporated by reference herein in its entirety.

BACKGROUND

1. Field

One or more embodiments described herein relate to an organic light-emitting display apparatus.

2. Description of the Related Art

An organic light-emitting display generates an image from pixels that include organic light-emitting devices. Each organic light-emitting device includes an organic emission layer between a hole injection electrode and an electron injection electrode. In operation, excitons are generated as holes from the hole injection electrode and electrons from the electron injection electrode combine in the organic emission layer. When the excitons change from an excited state to a ground state, light is emitted to form an image. Thus, an organic light-emitting display may be considered to be one type of self-emissive display.

Because it is self-emissive, an organic light-emitting display does not require a separate light source. Also, organic light-emitting displays may be driven at low voltage and is thinner, lighter in weight, and has excellent viewing angle, contrast, and response speed compared to other types of displays. As a result, organic light-emitting displays may be used in personal portable devices such as media players and mobile phones, as well as in larger displays such as monitors and televisions.

SUMMARY

In accordance with one or more embodiments, an organic light-emitting display apparatus having a pixel area to emit light and a transmission area to transmit external light, the organic light-emitting display apparatus includes a substrate; a scan wiring disposed on the substrate, the scan wiring extending in a first direction across the pixel area; a data wiring and a power wiring insulated from the scan wiring, the wiring and a power wiring extending in a second direction across the first direction, the data wiring and the power wiring adjacent to the pixel area and the transmission area; a switching transistor in the pixel area and connected to the scan wiring and the data wiring; a driving transistor in the pixel area and connected to the switching transistor and the power wiring; and an organic light-emitting device in the pixel area and connected to the driving transistor. At least one of the data wiring or the power wiring includes first wiring adjacent to the pixel area and including a mother wiring having a first width, and a second wiring including a plurality of branched wirings which branch from the mother wiring, the branched wirings adjacent to the transmission area, a width of each of the branched wirings less than the first width.

A sum of the widths of the branched wirings may be substantially equal to or greater than the first width. The widths of the branched wirings may be substantially equal to each other. The width of each of the branched wirings may be less than 10 µm.

The power wiring may include a first additional wiring extending in the first direction and having a mesh structure. The first additional wiring may include a plurality of wirings which extend across the transmission area, which are connected to each other, and which have widths less than the first width.

The apparatus may include an initialization voltage wiring to initialize a voltage applied to a electrode of the driving transistor, the initialization voltage wiring extending in the second direction and being adjacent to the pixel area and the transmission area. The initialization voltage wiring may include a first initialization voltage wiring adjacent to the pixel area and including a mother wiring having a second width, and a second initialization voltage wiring including a plurality of branched wirings which branch from the mother wiring having the second width and which are adjacent to the transmission area, wherein each of the branched wirings in the second initialization voltage wiring has a width less than the second width.

The initialization voltage wiring may include a second additional wiring extending in the first direction and having a mesh structure. The second additional wiring may include a plurality of wirings which extend across the transmission area, which are connected to each other, and which have widths less than the second width.

Each of the scan wiring, the data wiring, and the power wiring may include at least one of titanium (Ti), molybdenum (Mo), aluminum (Al), or copper (Cu). The pixel area may include a first emission area, a second emission area, and a third emission are to emit light of different colors, wherein the transmission area is adjacent to the first emission area, the second emission area, and the third emission area.

The organic light emitting device may include a pixel electrode connected to the driving transistor; an opposite electrode facing the pixel electrode; and an intermediate layer between the pixel electrode and the opposite electrode and including an organic emission layer to emits light, wherein the switching transistor and the driving transistor overlap the pixel electrode. The apparatus may include a pixel defining film covering at least a part of the pixel electrode, wherein the pixel defining film includes an opening in the transmission area.

In accordance with one or more embodiments, an organic light-emitting display apparatus includes a first display area and a second display area, each of the first and second display areas including a plurality of pixels, each of the pixels having a pixel area to emit light and a transmission area to transmit external light, the pixel including: a scan wiring extending in a first direction across the pixel area; a data wiring and a power wiring insulated from the scan wiring, the date wiring and a power wiring extending in a second direction across the first direction, the data wiring and the power wiring being adjacent to the pixel area and the transmission area, a switching transistor in the pixel area and connected to the scan wiring and the data wiring, a driving transistor in the pixel area and connected to the switching transistor and the power wiring, and an organic light-emitting device in the pixel area and connected to the driving transistor.

At least one of the data wiring or the power wiring in each of the pixels in the first display area includes a first wiring adjacent to the pixel area and a mother wiring having a first width, and a second wiring including a plurality of branched wirings which branch from the mother wiring and which are adjacent to the transmission area, a width of each of the branched wirings is less than the first width, and the data wiring and the power wiring in the pixels in the second display area have substantially uniform widths.

The transmittance of the first display area may be greater than transmittance of the second display area. The first display area and the second display area may be connected to each other to form one screen. The first display area may surround the second display area. A sum of widths of the branched wirings may be substantially equal to or greater than the first width. The widths of the branched wirings may be substantially equal to each other. The width of each of the branched wirings may be less than 10 μm. The scan wiring, the data wiring, and the power wiring may include at least one of titanium, molybdenum, aluminum, or copper.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
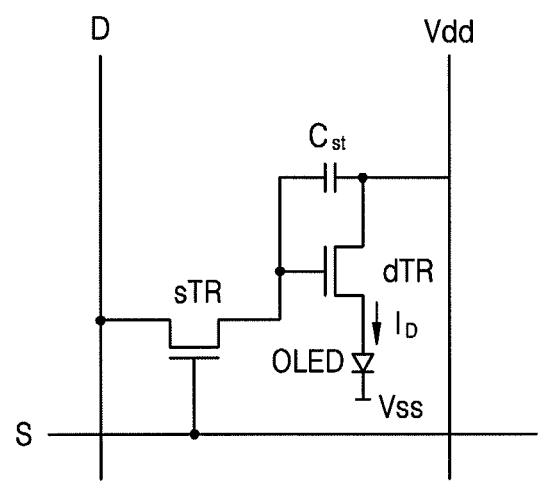
FIG. 1 illustrates an embodiment of a sub-pixel.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawings, the dimensions of layers and regions may be exaggerated for clarity of illustration. Like reference numerals refer to like elements throughout.

FIG. 1 illustrates an embodiment of a sub-pixel in a display device. The display device may be, for example, organic light-emitting display device. Referring to FIG. 1, the sub-pixel includes a plurality of wirings S, D, and Vdd, a switching transistor sTR, a driving transistor dTR, a capacitor Cst, and an organic light emitting device OLED.

The wirings S, D, and Vdd may include the scan wiring S extending in a first direction and the data wiring D and the power wiring Vdd extending in a second direction across the first direction. Although the sub-pixel includes two thin film transistors and one capacitor in FIG. 1, the sub-pixel may have a different number of transistors and/or capacitors in another embodiment.

The switching transistor sTR includes a gate terminal, a source terminal, and a drain terminal. The gate terminal, the source terminal, and the drain terminal may be respectively connected to the scan wiring S, the data wiring D, and the driving transistor dTR. The switching transistor sTR transfers a data signal to the driving transistor dTR in response to a scan signal applied to the gate terminal.

The driving transistor dTR includes a gate terminal, a source terminal, and a drain terminal. The gate terminal, the source terminal, and the drain terminal may be respectively connected to the switching transistor sTR, the power wiring Vdd, and the organic light emitting device OLED. The driving transistor dTR enables an output current to flow with an intensity that varies according to a voltage applied between the gate terminal and the drain terminal.

The capacitor Cst is connected between the gate terminal and the source terminal of the driving transistor dTR. The capacitor Cst charges the data signal applied to the gate terminal and maintains the data signal after the switching transistor sTR is turned off.

The organic light emitting device OLED includes a pixel electrode (e.g., 121 in FIG. 3) connected to the drain terminal of the driving transistor dTR and an opposite electrode (e.g., 122 in FIG. 3) connected to a common voltage line Vss. The organic light emitting device OLED emits light by varying an intensity thereof according to the intensity of the output current of the driving transistor dTR.

Figure 2:
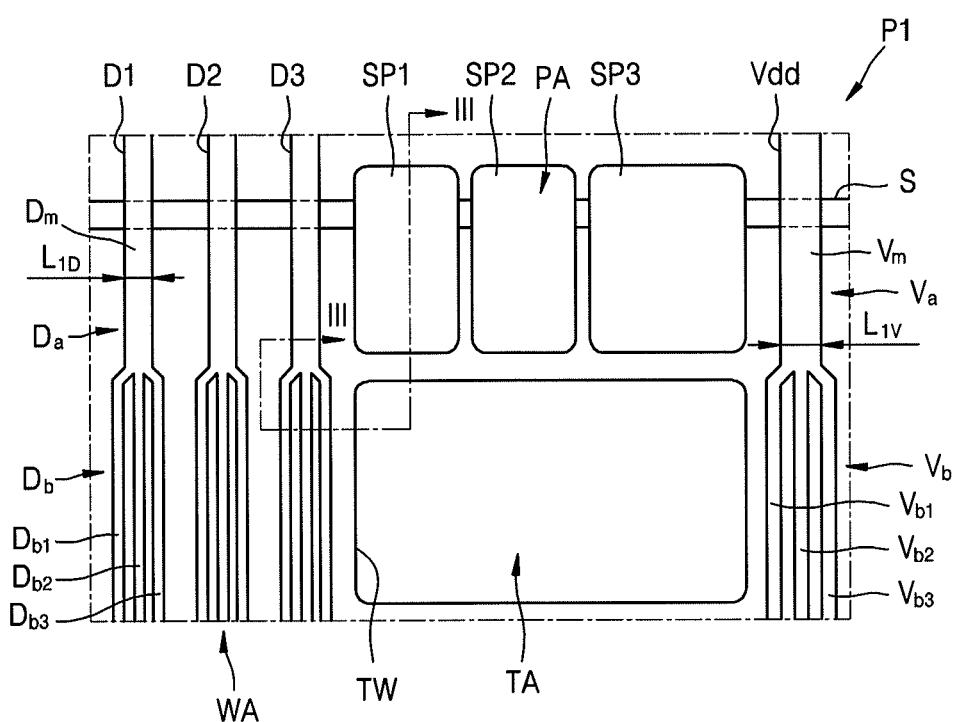
FIG. 2 illustrates an embodiment of a pixel.
Figure 3:
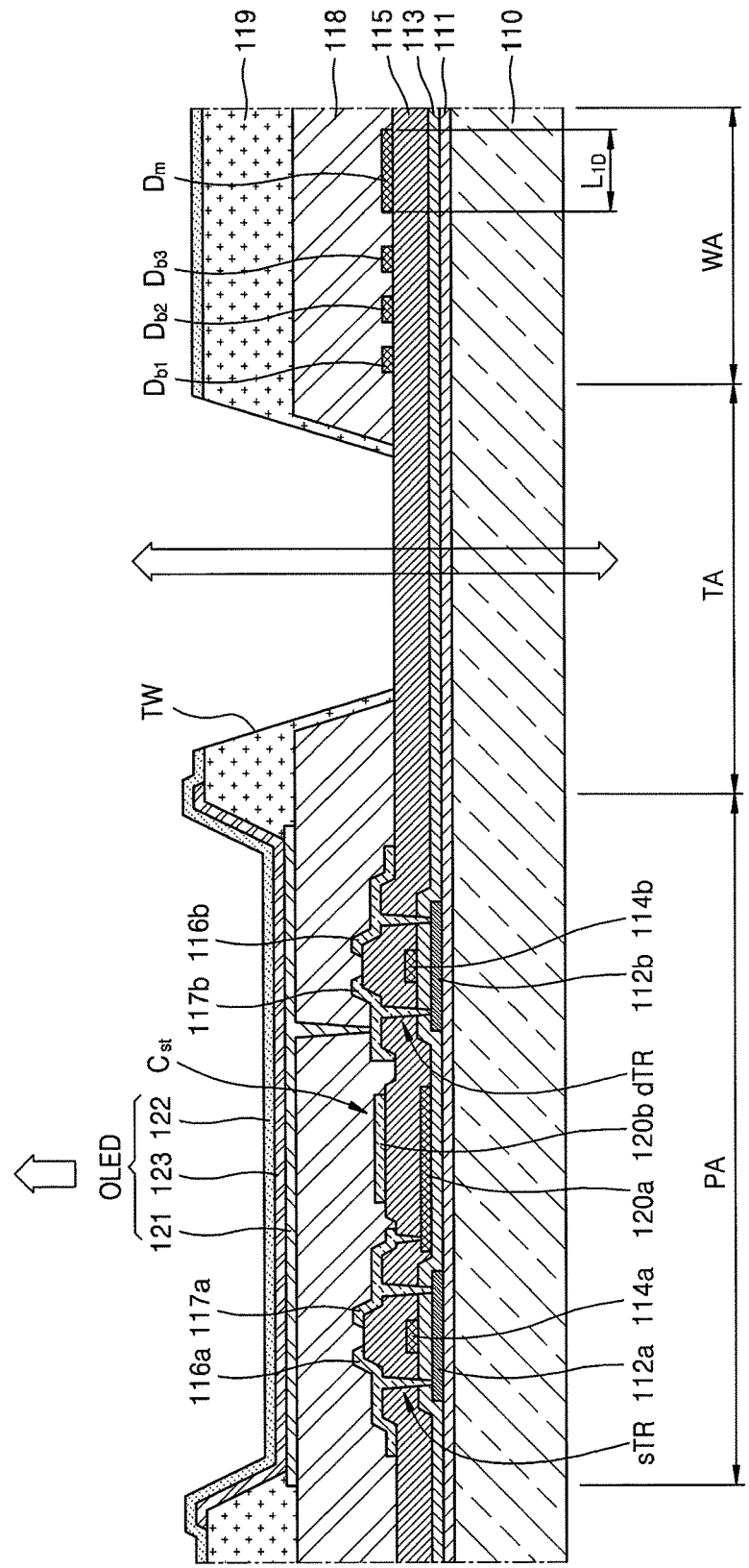
FIG. 3 illustrates a view along section line III-III in FIG. 2.

FIG. 2 illustrates an embodiment of a pixel P1 in the organic light-emitting display apparatus of FIG. 1. FIG. 3 is a cross-sectional view along a line III-III in FIG. 2. The organic light-emitting display apparatus may include a plurality of pixels, like P1, which emit light to form an image.

The pixel P1 includes a pixel area PA, a transmission area TA, and a wiring area WA. The pixel area emits light. The transmission area TA transmits external light. The wiring area WA includes data wirings D1, D2, and D3, scan wiring S, and power wiring Vdd. Scan wiring S extends in a first direction across the pixel area PA, and data wirings D1, D2, and D3 and power wiring Vdd extends in a second direction adjacent to the pixel area PA and the transmission area TA.

The switching thin film transistor sTR is disposed in the pixel area PA and is electrically connected to the scan wiring S and the data wirings D1, D2, and D3. The driving thin film transistor dTR is disposed in the pixel area PA and is electrically connected to the switching thin film transistor sTR and the power wiring Vdd. The organic light emitting device OLED is disposed in the pixel area PA and is electrically connected to the driving thin film transistor dTR.

In one embodiment, the wiring area WA includes the scan wiring S, the data wirings D1, D2, and D3, and the power wiring Vdd. The wiring area WA may be outside the pixel area PA and the transmission area TA. The pixel P1 may be partitioned from another pixel by the wiring area WA, e.g., the wiring area WA may be between pixel P1 and an adjacent pixel.

In one embodiment, the pixel area PA includes first through third emission units SP1, SP2, and SP3 that emit light of different colors. A combination of these colors may form white light. The transmission area TA may be adjacent to the first through third emission units SP1, SP2, and SP3. External light may be recognized by a user after being transmitted through the transmission area TA.

The scan wiring S transfers a scan signal to the switching transistor sTR and extends in the first direction across the pixel area PA. The scan wiring S may not extend across the transmission area TA and may have a generally uniform width.

The data wirings D1, D2, and D3 may be electrically connected to the switching transistor sTR, through which a data signal may be transferred to the driving transistor dTR. The data wirings D1, D2, and D3 may respectively transfer data signals to the first through third emission units SP1, SP2, and SP3.

The data wirings D1, D2, and D3 include a first wiring unit Da extending in the second direction adjacent to the pixel area PA and a second wiring unit Db. The first wiring unit Da includes a mother wiring Dm adjacent to the pixel area PA and having a first width L1D. The second wiring unit Db includes a plurality of branched wirings Db1, Db2, and Db3 which are branched from the mother wiring Dm and which are adjacent to the transmission area TA. The width of each of the branched wirings Db1, Db2, and Db3 may be less than the first width L1D.

A plurality of wirings may be used to drive the pixel P1 in the organic light-emitting display apparatus. These wirings may deteriorate the transmittance of external light, which compromises the ability to see-through the organic light-emitting display apparatus. The transmission area TA may be increased, and the pixel area PA may be reduced in order to increase the transmittance of the organic light-emitting display apparatus. However, in this case, an opening ratio may be reduced. As a result, the lifespan of the organic light-emitting display apparatus may be reduced.

In accordance with one embodiment, the plurality of branched wirings Db1, Db2, and Db3 have widths sufficiently small that they are effectively invisible to or undetectable by the naked eye of a user. In one non-limiting embodiment, the widths of the branched wirings Db1, Db2, and Db3 may be less than 10 µm. In another embodiment, the branched wirings Db1, Db2, and Db3 may have a different (e.g., greater) width or widths.

In one embodiment, the three branched wirings Db1, Db2, and Db3 may be included in the second wiring unit Db of the data wirings D1, D2, and D3, and may have substantially the same widths. In another embodiment, the number of branched wirings may be two or more than three and may have different widths.

Although the branched wirings Db1, Db2, and Db3 may have small widths, since the branched wirings Db1, Db2, and Db3 are electrically connected to the mother wiring Dm and have a parallel connected shape. In other words, each of the branched wirings Db1, Db2, and Db3 includes connection portion contacting with the mother wiring Dm and main portion extending from the connection portion and main portions of the branched wirings Db1, Db2, and Db3 is parallel each other. Thus, any increase in resistance of the branched wirings Db1, Db2, and Db3 that might occur as a result of their small widths may be reduced or minimized. In one embodiment, the sum of the widths of the branched wirings Db1, Db2, and Db3 in the second wiring unit Db may be equal to or greater than the first width L1D. In this case, an increase in resistance of the branched wirings Db1, Db2, and Db3 may be further reduced or minimized.

The power wiring Vdd may supply a power signal to each of the first through third emission units SP1, SP2, and SP3 in the pixel P1 and may be electrically connected to the driving transistor dTR. The power wiring Vdd extends in the second direction adjacent to the pixel area PA and the transmission area TA, and may include a first wiring unit Va and a second wiring unit Vb. The first wiring unit Va includes a mother wiring Vm adjacent to the pixel area PA and having a first width L1V. The second wiring unit Vb includes a plurality of branched wirings Vb1, Vb2, and Vb3 branched from the mother wiring Vm and is adjacent to the transmission area TA. The width of each of the branched wirings Vb1, Vb2, and Vb3 may be less than the first width L1V.

The widths of the branched wirings Vb1, Vb2, and Vb3 may have values that effectively make them invisible to the naked eye of a user. According to one non-limiting embodiment, each of the widths of the branched wirings Vb1, Vb2, and Vb3 may be less than 10 µm. In another embodiment, the widths may be substantially equal to or greater than 10 µm when, for example, the structure or layout of the pixel and/or display device permits those widths to be virtually undetectable by a user.

Although the branched wirings Vb1, Vb2, and Vb3 may have small widths, since the branched wirings Vb1, Vb2, and Vb3 are electrically connected to the mother wiring Vm and electrically connected in parallel each other. In other words, each of the branched wirings Db1, Db2, and Db3 includes connection portion contacting with the mother wiring Dm and main portion extending from the connection portion and main portions of the branched wirings Db1, Db2, and Db3 is parallel each other. Thus, an increase in resistance of the power wiring V based on the small widths may be reduced or minimized.

In one embodiment, the sum of the widths of the branched wirings Vb1, Vb2, and Vb3 in the second wiring unit Vb may be equal to or greater than the first width L1V. Thus, a resistance increase of the power wiring V may be further reduced or minimized, whether the branched wirings Vb1. Vb2, and Vb3 are parallel or not.

In one embodiment, the three branched wirings Vb1, Vb2, and Vb3 may be in the second wiring unit Vb of the power wiring Vdd, and may have substantially the same widths. In another embodiment, the number of branched wirings may be two or more than three and may have different widths.

In one embodiment, the data wirings D1, D2, and D3 and the power wiring Vdd include the first wiring units Da and Va and the mother wirings Dm and Vm having the first widths L1D and L1V, and the second wiring units Db and Vb which include the branched wirings Db1, Db2, Db3, Vb1, Vb2, and Vb3 branched from the mother wirings Dm and Vm. In one embodiment, only one of the data wirings D1, D2, and D3 or the power wiring Vdd may include the first wiring units Da and Va and the second wiring units Db and Vb.

For example, at least one of the data wirings D1, D2, and D3 and the power wiring Vdd may include the first wiring units Da and Va and the second wiring units Db and Vb. The second wiring units Db and Vb may include only wirings having small widths which are effectively invisible or undetectable by a user. Thus, light incident on the organic light-emitting display apparatus may be transmitted through the second wiring units Db and Vb and may be not be visibly recognized by the user. Thus, an effect of expanding the transmission area TA to a part of the wiring area WA may be produced. As a result, transmittance of the organic light-emitting display apparatus may be improved by not reducing an opening ratio, while at the same time reducing or minimizing an increase in resistance of the wirings.

FIG. 3 illustrates a cross-sectional structure of the organic light-emitting display apparatus according to one embodiment. The substrate 110 includes areas corresponding to the pixel area PA, the transmission area TA, and the wiring area WA of the pixel P1, respectively and may be formed, for example, of glass or plastic. A buffer layer 111 may be on the substrate 110. The buffer layer 111 may prevent impure elements from penetrating through the substrate 110, and may also serve to planarize the surface of the substrate 110. The buffer layer 111 may be a single layer or may include multiple layers of an inorganic material, e.g., silicon nitride (SiNx) and/or silicon oxide (SiOx).

The switching thin film transistor sTR, the driving thin film transistor dTR, and the capacitor Cst may be in the pixel area PA of the buffer layer 111. Each of the switching thin film transistor sTR and the driving thin film transistor dTR may include active layers 112a and 112b, gate electrodes 114a and 114b insulated from the active layers 112a and 112b, and source electrodes 116a and 116b and drain electrodes 117 and 117b electrically connected to the active layers 112a and 112b, respectively. A first insulating film 113 may be between the active layers 112a and 112b and the gate electrodes 114a and 114b. A second insulating film 115 may be between the gate electrodes 114a and 114b, the source electrodes 116a and 116b, and the drain electrodes 117a and 117b.

The first insulating film 113 may be, for example, a single film of $SiO_2$. The second insulating film 115 may be a single layer or may include multiple layers of, for example, SiO2 and/or SiNx.

The switching thin film transistor sTR and the driving thin film transistor dTR may be, for example, a top-gate type where the gate electrodes 114a and 114b are on the active layers 112a and 112b. In another embodiment, the gate electrodes 114a and 114b may be below the active layers 112a and 112b.

The active layers 112a and 112b may include various materials. For example, the active layers 112a and 112b may include an inorganic semiconductor material, such as amorphous silicon or crystalline silicon. In another example, the active layers 112a and 112b may include an oxide semiconductor or an organic semiconductor material.

The gate electrodes 114a and 114b may be a single layer or may include multiple layers that include, for example, at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu). A scan wiring S may be on the same layer and may include the same material as the gate electrodes 114a and 114b.

In one embodiment, the scan wiring S may include, for example, at least one metal of titanium (Ti), molybdenum (Mo), aluminum (Al), or copper (Cu) In one embodiment, the scan wiring S may include Mo, Mo/Al, Ti/Al/Ti, or Mo/Al/Mo, etc.

The source electrodes 116a and 116b and the drain electrodes 117a and 117b may include at least two metal layers of, for example, Pt, Pd, Ag, Mg, Au, Ni, Nd, Ir, Cr, Li, Ca, Mo, Ti, W, Cu, or an alloy thereof. The data wirings D1, D2, and D3 and the power wiring Vdd may be on the same layer and may include the same material as the source electrodes 116a and 116b and the drain electrodes 117a and 117b.

In one embodiment, the data wirings D1, D2, and D3 and the power wiring Vdd may be include at least one of Ti, Mo, Al, Cu, or another metal. In one embodiment, the data wirings D1, D2, and D3 and the power wiring Vdd may include Ti/Al/Ti or Mo/Al/Mo. Aluminum (Al) may be included in the data wirings D1, D2, and D3, and the power wiring Vdd may be thicker than aluminum (Al) in the scan wiring D in order to reduce wiring resistance. Although widths of the data wirings D1, D2, and D3 and the power wiring Vdd are thin, the resistance may not be significantly increased.

The capacitor Cst may include lower and upper electrodes 120a and 120b.

A third insulating film 118 may be on the second insulating film 115 to cover the switching thin film transistor sTR, the driving thin film transistor dTR, and the capacitor Cst. A pixel electrode 121 may be electrically connected to a drain electrode 117b of the driving thin film transistor dTR, an opposite electrode 122 facing the pixel electrode 121, and an intermediate layer 123 between the pixel electrode 121 and the opposite electrode 122. The pixel electrode 121 may include an organic emission layer that emits light and may be disposed on the third insulating film 118.

Edges of the pixel electrode 121 may be covered by a pixel-defining film 119. The third insulating film 118 and the pixel-defining film 119 may each include an organic material, e.g., polyimide (PI). The third insulating film 118 may function to cover and planarize driving elements. The pixel-defining film 119 may function to define an emission area, prevent an electric field from concentrating at an edge of the pixel electrode 121, and prevent the pixel electrode 121 and the opposite electrode 122 from being short-circuited.

The pixel-defining film 119 may include an opening in the transmission area TA. For example, the opening is in an area of the pixel-defining film 119 in the transmission area TA. Thus, a transmission window TW having a higher transmittance than that of another area may be formed in the transmission area TA, thereby improving the transmittance of the organic light emitting display apparatus. To further improve the transmittance, the opening may be formed in at least one of the first through third insulating films 113, 115, and 118.

The pixel electrode 121 may be a reflective electrode including a reflective layer. The reflective layer may include, for example, at least one of Ag, Mg, Al, Pt, Pd, Au, Ni, Nd, Ir, or Cr. A transparent electrode layer and a semi-transmittance electrode layer formed of at least one of indium tin oxide (ITO), indium zinc oxide (IZO), zinc oxide (ZnO), indium oxide (In2O3), indium gallium oxide (IGO), or aluminum zinc oxide (AZO) may be further disposed on the reflective layer. In one embodiment, the pixel electrode 121 may have a triple structure of ITO/Ag/ITO, and may be configured as the reflective electrode by sufficiently increasing a thickness of Ag.

The opposite electrode 122 may be a transparent electrode or a semi-transmittance electrode, and may include at least one of Ag, Al, Mg, Li, Ca, Cu, LiF/Ca, LiF/Al, MgAg, or CaAg. The opposite electrode 122 may be a thin-film having a thickness, for example, from several to dozens of nm. The opposite electrode 122 may be electrically connected throughout all pixels in the organic light-emitting display apparatus.

The intermediate layer 123 may be between the pixel electrode 121 and the opposite electrode 122. The intermediate layer 123 includes an organic emission layer that emits light, and may further include at least one of a hole injection layer (HIL), a hole transport layer (HTL), an electron transport layer (ETL), or an electron injection layer (EIL). In one embodiment, various functional layers may be further disposed between the pixel electrode 121 and the opposite electrode 122.

The organic emission layer may emit red light, green light, or blue light. In another embodiment, the organic emission layer may emit white light. In this case, the organic emission layer may have a structure in which a light-emitting substance emitting red light, a light-emitting substance emitting green light, and a light-emitting substance emitting blue light are stacked on one another, or a structure in which a light-emitting substance emitting red light, a light-emitting substance emitting green light, and a light-emitting substance emitting blue light are mixed. In another embodiment, a pixel may emit a combination of other colors (e.g., ones different from red, green, and/or blue), for example, which are capable of emitting white light.

When the organic emission layer emits the white light, the organic light-emitting display apparatus may further include color filters of different colors respectively corresponding to the first through third emission units SP1, SP2, and SP3.

The organic light-emitting display apparatus may be, for example, a top-emission type that generates an image in a direction of the opposite electrode 122. The switching thin film transistor sTR, the driving thin film transistor dTR, and the capacitor Cst may overlap the pixel electrode 121 in a plan view. For example, a driving circuit unit may overlap the pixel electrode 121, and thus no additional space for the driving circuit unit is necessary, thereby improving an opening ratio and easily implementing high resolution.

Figure 4:
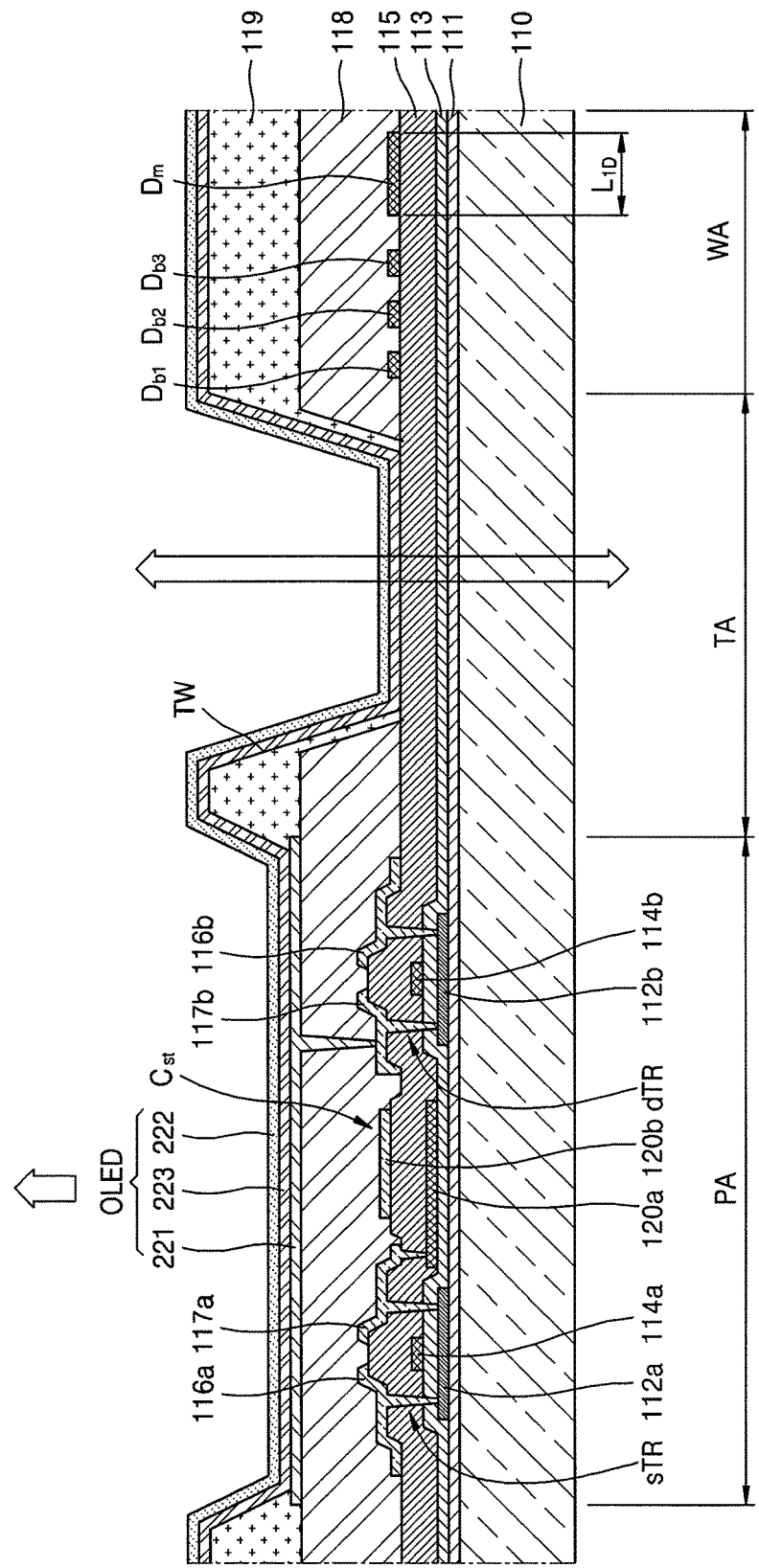
FIGS. 4 and 5 illustrate a view along section line III-III in FIG. 2.
Figure 5:
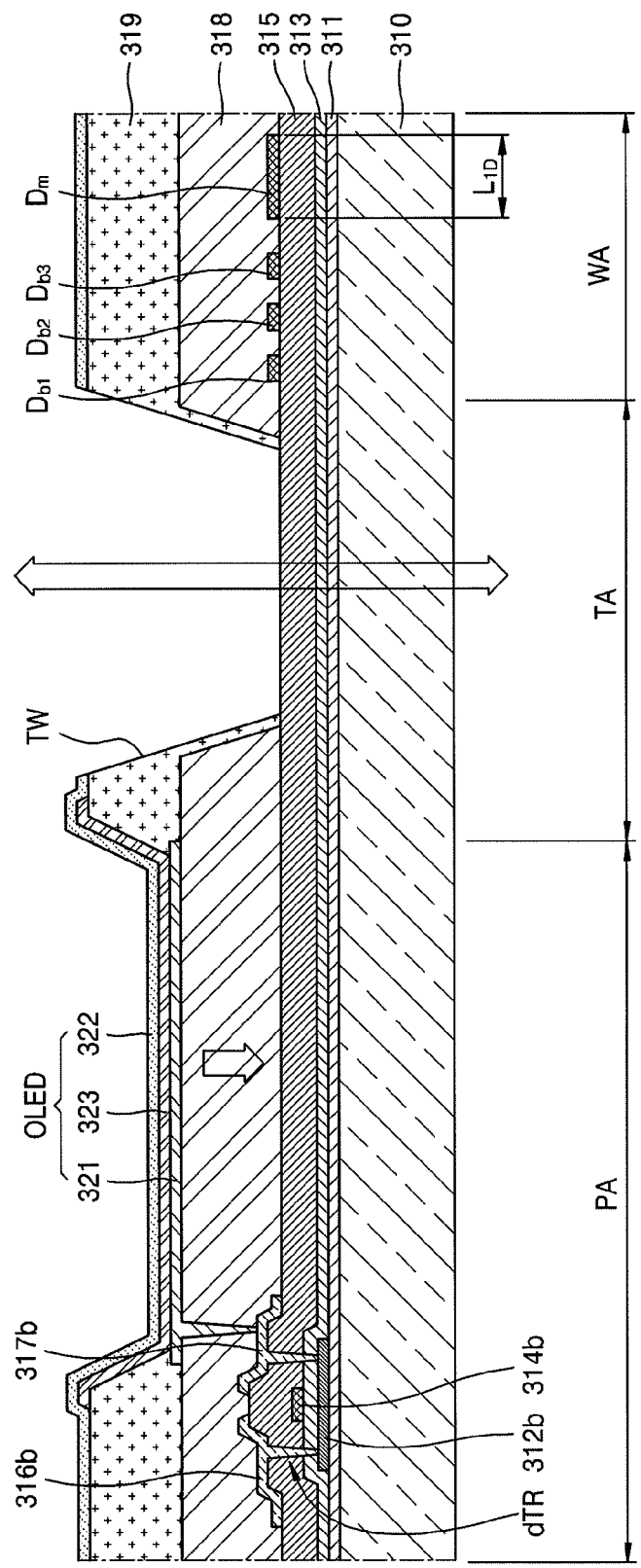

FIGS. 4 and 5 illustrate cross-sectional views taken of various embodiments taken along line III-III in FIG. 2. Referring to FIG. 4, the organic light emitting display apparatus includes an intermediate layer 223 and an opposite electrode 222 that extend to the transmission window TW along an upper surface of the pixel-defining film 119 and an opening in the pixel-defining film 119.

The opposite electrode 222 may be a transparent electrode or a semi-transparent electrode, and the intermediate layer 223 is also formed of a transparent organic material. Thus, although the intermediate layer 223 and the opposite electrode 222 are in the transmission area TA, external light incident on the organic light emitting display apparatus may be visibly recognized by a user through the transmission area TA. As a result of this configuration, the intermediate layer 223 and the opposite electrode 222 may be easily deposited, thereby improving production of the display.

Referring to FIG. 5, the organic light emitting display apparatus includes a substrate 310 that includes areas corresponding to a pixel area PA to emit light, a transmission area TA for transmitting external light, and a wiring area WA including wirings of the pixel P1, respectively. The buffer layer 311 may dispose on the substrate 310.

The substrate 310 may include, for example, glass or plastic. The buffer layer 311 may be a single layer or may include multiple layers that include, for example, an inorganic material such as silicon nitride (SiNx) and/or silicon oxide (SiOx).

The driving transistor dTR may be in the pixel area PA of the buffer layer 311, and may include an active layer 312*b*, a gate electrode 314*b*, a source electrode 316*b*, and a drain electrode 317*b*. A first insulating film 313 may be between the active layer 312*b* and the gate electrode 314*b*. A second insulating film 315 may be between the gate electrode 314*b*, the source electrode 316*b*, and the drain electrode 317*b*.

A third insulating film 318 may serve to planarize circuit elements such as the driving thin film transistor dTR and may be on the second insulating film 315. A pixel electrode 321 is electrically connected to a drain electrode 317*b*, an opposite electrode 322 facing the pixel electrode 321, and an intermediate layer 323 between the pixel electrode 321 and the opposite electrode 322. The pixel electrode 321 may include a light-emitting organic emission layer on the third insulating film 318. Two edges of the pixel electrode 321 may be covered by a pixel-defining film 319.

The pixel electrode 321 may include a transparent conductive layer and a semi-transmittance layer. The transparent conductive layer may include, for example, at least one of indium tin oxide (ITO), indium zinc oxide (IZO), zinc oxide (ZnO), indium oxide (In2O3), indium gallium oxide (IGO), or aluminum zinc oxide (AZO). The semi-transmittance layer may include, for example, at least one of Ag, Mg, Al, Pt, Pd, Au, Ni, Nd, Ir, Cr, Li, Ca, or Yb and may be formed of a thin film, for example, having a thickness of several nm to several tens nm.

The opposite electrode 322 may be a reflective electrode and, for example, may include at least one of Ag, Al, Mg, Li, Ca, Cu, LiF/Ca, LiF/Al, MgAg, or CaAg. The opposite electrode 322 may include an opening in the transmission area TA. The opening may pass through the third insulating film 318 and the pixel defining film 319 in the transmission area TA. The area including the opening may correspond, for example, to the transmission window TW in the transmission area TA. The opposite electrode 322, the intermediate layer 323, the pixel defining layer 319, and the third insulating film 318 are not disposed in the transmission window TW. As a result, high transmittance may be obtained.

The intermediate layer 323 may be between the pixel electrode 321 and the opposite electrode 322. The intermediate layer 323 includes an organic emission layer that emits light, and may further include at least one of a hole injection layer (HIL), a hole transport layer (HTL), an electron transport layer (ETL), or an electron injection layer (EIL), but is not limited thereto. Various functional layers may be further disposed between the pixel electrode 321 and the opposite electrode 322.

The organic light-emitting display apparatus may be, for example, a bottom-emission type in which an image is formed in a direction of the substrate 310. One or more circuit elements (e.g., the driving thin film transistor dTR) may be provided so as to not overlap an emission area defined by the pixel defining film 319. For example, light emitted by the intermediate layer 323 may be emitted to the outside without interference from the circuit elements.

Figure 6:
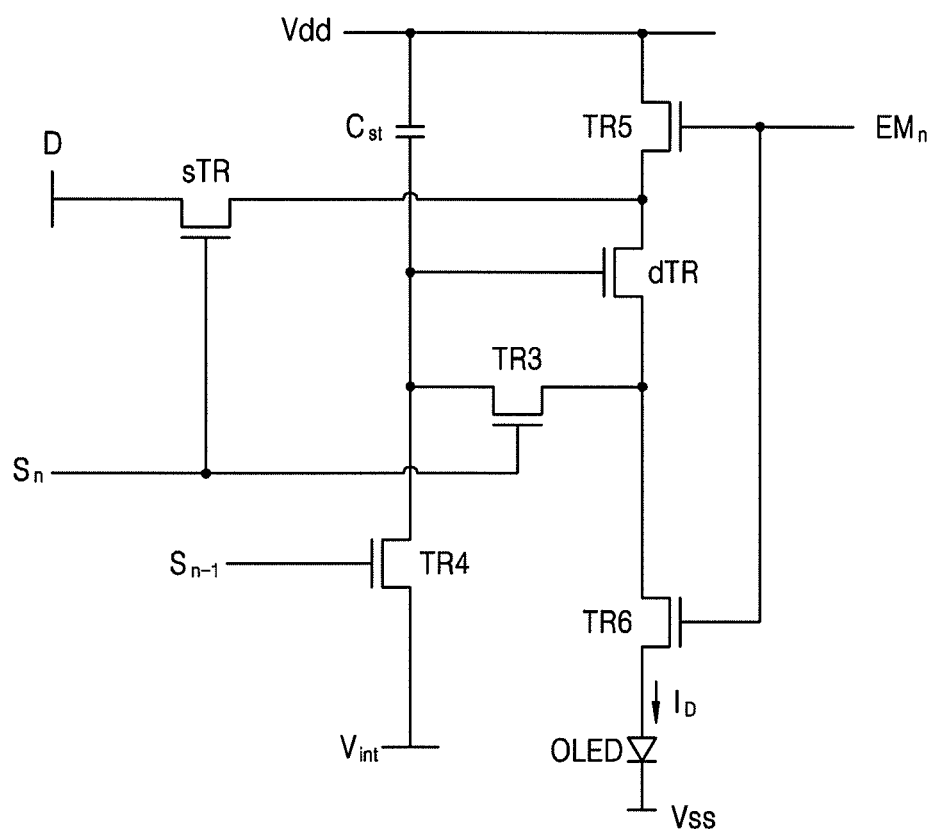
FIG. 6 illustrates another embodiment of a sub-pixel.

FIG. 6 illustrates another embodiment of a sub-pixel of an organic light-emitting display apparatus. Referring to FIG. 6, the sub-pixel includes a plurality of wirings Sn, Sn−1, EMn, D, Vdd, and Vint, the switching transistor sTR, the driving transistor dTR, a compensation thin film transistor TR3, an initialization thin film transistor TR4, an operation control thin film transistor TR5, an emission control thin film transistor TR6, the capacitor Cst, and the organic light emitting device OLED. Although the sub-pixel includes six thin film transistors and one capacitor in FIG. 6, the sub-pixel may include a different number of transistors and/or capacitors in another embodiment.

The driving transistor dTR has a gate electrode connected to the capacitor Cst, a source electrode connected to the power wiring Vdd via the operation control thin film transistor TR5, and a drain electrode connected to the organic light emitting device OLED via the emission control thin film transistor TR6. The driving transistor dTR transfers a data signal according to a switching operation of the switching transistor sTR, and supplies a driving current ID to the organic light emitting device OLED.

The switching transistor sTR has a gate electrode connected to the scan wiring Sn, a source electrode connected to the data wiring D, and a drain electrode connected to the source electrode of the driving transistor dTR and to the power wiring Vdd via the operation control thin film transistor TR5. The switching transistor sTR may be turned on according to a scan signal received through the scan wiring Sn, and performs a switching operation for transferring the data signal from the data wiring D to the source electrode of the driving transistor dTR.

The compensation thin film transistor TR3 may be turned on according to the scan signal received through the scan wiring Sn, to connect the gate electrode and the drain electrode of the driving transistor dTR to each other, and to connect the driving transistor dTR to a diode. A threshold voltage of the driving transistor dTR is therefore compensated.

The initialization thin film transistor TR4 has a gate electrode connected to a previous scan wiring Sn−1 and a source electrode connected to an initialization voltage wiring Vint. The initialization thin film transistor TR4 may be turned on according to a previous scan signal from the previous scan wiring Sn−1, to transfer an initialization voltage to the driving transistor dTR and to initialize a voltage of the gate electrode of the driving transistor dTR.

The operation control thin film transistor TR5 may be turned on according to an emission control signal transferred by an emission control line EMn, to transfer a driving voltage to the driving transistor dTR.

The emission control thin film transistor TR6 may be turned on according to an emission control signal transferred by the emission control line EMn, to transfer the diving voltage from the driving transistor dTR to the organic light emitting device OLED.

In one embodiment, the operation control thin film transistor TR5 and the emission control thin film transistor TR6 may be continuously turned on according to the emission control signal from the emission control line EMn, to transfer the driving voltage to the organic light emitting device OLED and to allow the driving current ID to the organic light emitting device OLED.

The capacitor Cst may be connected to the driving transistor dTR and the power wiring Vdd. The organic light emitting device OLED includes a pixel electrode connected to the drain electrode of the driving transistor dTR and an opposite electrode connected to the common voltage line Vss. The organic light emitting device OLED emits light by varying intensity thereof according to the intensity of an output current of the driving transistor dTR.

Figure 7:
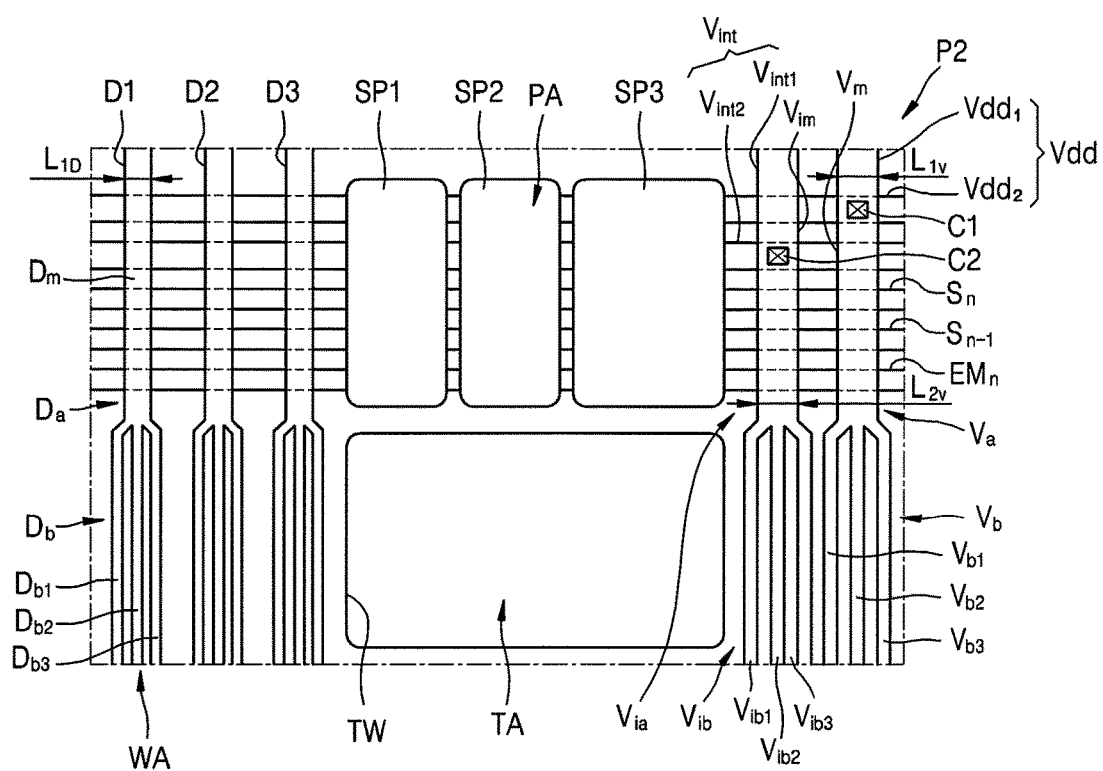
FIG. 7 illustrates another embodiment of a pixel.

FIG. 7 illustrates an embodiment of a pixel P2 in the organic light-emitting display apparatus of FIG. 6. Referring to FIG. 7, the organic light-emitting display apparatus may include a plurality of pixels, of which pixel P2 is exemplary. The pixel P2 includes a pixel area PA to emit light, a transmission area TA to transmit external light, and a wiring area WA including wirings Sn, Sn−1, EMn, D1, D2, D3, Vint, and Vdd.

The scan wiring Sn, the previous scan wiring Sn−1, and the emission control line EMn may extend in a first direction across the pixel area PA. The data wirings D1, D2, and D3, the initialization wiring Vint, and the power wiring Vdd D and the power wiring Vdd may extend in a second direction across the first direction to be adjacent to the pixel area PA and the transmission area TA.

In one embodiment, the pixel area PA may include the first through third emission units SP1, SP2, and SP3 that emit light of different colors. A combination of these colors may form a white light. The transmission area TA may be adjacent to the first through third emission units SP1 SP2, and SP3. External light may be recognized by a user after being transmitted through the transmission area TA of the organic light-emitting display apparatus.

The scan wiring Sn, the previous scan wiring Sn−1, and the emission control line EMn may not extend across the transmission area TA and may have a generally uniform width according to one embodiment.

The data wirings D1, D2, and D3 may include the first wiring unit Da and a second wiring unit Db. The first wiring unit Da may be adjacent to the pixel area PA and may include the mother wiring Dm having the first width L1D. The second wiring unit Db include the branched wirings Db1, Db2, and Db3 branched from the mother wiring Dm and may be adjacent to the transmission area TA. The width of each of the plurality of branched wirings Db1, Db2, and Db3 may be less than the first width L1D in one embodiment.

The widths of the branched wirings Db1, Db2, and Db3 may have values that allow them to be effectively invisible to a user. For example, the widths of the branched wirings Db1, Db2, and Db3 may be less than 10 μm. The widths of the branched wirings Db1, Db2, and Db3 may be substantially the same or different. In one embodiment, the sum of the widths of the branched wirings Db1, Db2, and Db3 may be equal to or greater than the first width L1D.

The power wiring Vdd extends in the second direction adjacent to the pixel area PA and the transmission area TA, and may include the first wiring unit Va including the mother wiring Vm adjacent to the pixel area PA and having the first width L1V. The second wiring unit Vb includes the plurality of branched wirings Vb1, Vb2, and Vb3 branched from the mother wiring Vm and may be adjacent to the transmission area TA. The width of each of the branched wirings Vb1, Vb2, and Vb3 may be less than the first width L1V in one embodiment.

The widths of the branched wirings Vb1, Vb2, and Vb3 may have values which allow them to effectively be invisible to or undetected by the naked eye of a user. For example, the widths of the branched wirings Vb1, Vb2, and Vb3 may be less than 10 μm. The widths of the branched wirings Vb1, Vb2, and Vb3 may be substantially the same or different. The sum of the widths of the branched wirings Vb1, Vb2, and Vb3 may be equal to or greater than the first width L1V in one embodiment.

The power wiring Vdd may include a first additional wiring unit Vdd2 extending in the first direction. For example, the power wiring Vdd may include a main power wiring Vdd1 extending in the second direction and the first additional wiring unit Vdd2, and may have a mesh structure to reduce a voltage drop in the power wiring Vdd as the power wiring Vdd extends farther away from a power supply unit.

In one embodiment, the first additional wiring unit Vdd2 may extend in a direction parallel to the scan wiring Sn across the pixel area PA. The first additional wiring unit Vdd2 may be in a different layer from that of the main power wiring Vdd1, and may be electrically connected to the main power wiring Vdd1 through a first contact unit C1. The first additional wiring unit Vdd2 may have generally a uniform width.

The initialization voltage wiring Vint extends in the second direction adjacent to the pixel area PA and the transmission area TA, and may include a first initialization voltage wiring unit Via including a mother wiring Vim adjacent to the pixel area PA and having a second width L2V. A second initialization voltage wiring unit Vib includes a plurality of branched wirings Vib1, Vib2, and Vib3 branched from the mother wiring Vim and disposed adjacent to the transmission area TA. The width of each of the branched wirings Vib1, Vib2, and Vib3 may be less than the first width L2V in one embodiment.

The initialization voltage wiring Vint may include a second additional wiring unit Vint2 extending in the first direction. For example, the initialization voltage wiring Vint may include a main initialization voltage wiring Vint1 extending in the second direction and the second additional wiring unit Vint2, and may have a mesh structure.

In one embodiment, the second additional wiring unit Vint2 may extend in a direction parallel to the scan wiring Sn across the pixel area PA. The second additional wiring unit Vint2 may be in a different layer from that of the main initialization voltage wiring Vint1, and may be electrically connected to the main power wiring Vdd1 through a second contact unit C2. The second additional wiring unit Vint2 may have generally a uniform width.

Figure 8:
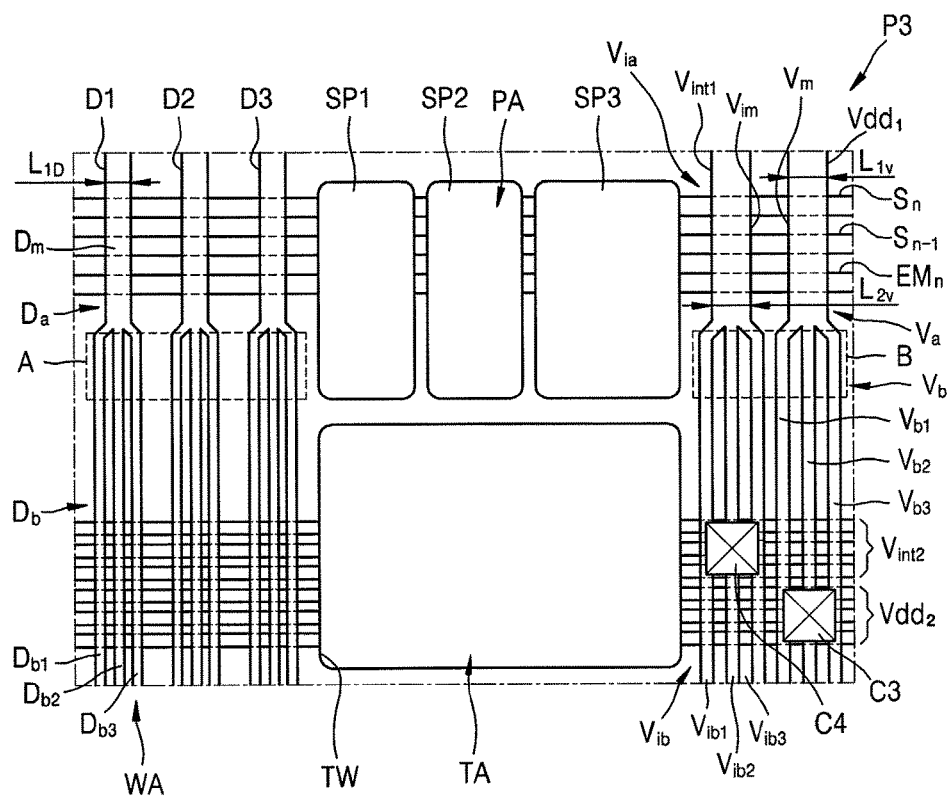
FIG. 8 illustrates another embodiment of a pixel.

FIG. 8 illustrates another embodiment of a pixel P3, that may be exemplary of the pixels in the organic light-emitting display apparatus of FIG. 6. Referring to FIG. 8, the power wiring Vdd in the pixel P3 may have a mesh structure including the main power wiring Vdd1 extending in a second direction and the first additional wiring unit Vdd2. The first additional wiring unit Vdd2 may include a plurality of wirings electrically connected to each other across the transmission area TA, each having a width less than the first width L1V.

The widths of the wirings in the first additional wiring unit Vdd2 may allow them to effectively be invisible to or undetected by the naked eye of a user, e.g., may be less than 10 µm. The first additional wiring unit Vdd2 may include, for example, three wirings. In another embodiment, the first additional wiring unit Vdd2 may include two or more than three wirings.

The first additional wiring unit Vdd2 may be electrically connected to the main power wiring Vdd1 through a third contact hole C3. The wirings may have a parallel connected shape.

The main power wiring Vdd1 extends in a second direction adjacent to the pixel area PA and the transmission area TA, and may include the first wiring unit Va including the mother wiring Vm adjacent to the pixel area PA and having the first width L1V. The second wiring unit Vb includes the plurality of branched wirings Vb1, Vb2, and Vb3 which are branched from the mother wiring Vm and which are adjacent to the transmission area TA.

The initialization voltage wiring Vint in the pixel P3 may have a mesh structure including the main initialization voltage wiring Vinti1 extending in a second direction and the second additional wiring unit Vint2 extending in a first direction. The second additional wiring unit Vint2 may include a plurality of wirings electrically which are connected to each other across the transmission area TA and which have a width less than the second width L2V.

The widths of the wirings in the second additional wiring unit Vint2 may allow them to be effectively invisible to or undetected by the naked eye of a user, e.g., may be less than 10 µm. The second additional wiring unit Vint2 may include three wirings. In another embodiment, the second additional wiring unit Vint2 may include two or more than three wirings.

The second additional wiring unit Vint2 may be electrically connected to the main initialization voltage wiring Vinti1 through a fourth contact hole C4. The wirings may have a parallel connected shape.

The main initialization voltage wiring Vinti1 extends in the second direction adjacent to the pixel area PA and the transmission area TA, and may include the first initialization voltage wiring unit Via including the mother wiring Vim adjacent to the pixel area PA and having the second width L2V. The second initialization voltage wiring unit Vib includes the branched wirings Vib1, Vib2, and Vib3 which are branched from the mother wiring Vim and which are adjacent to the transmission area TA.

In embodiment, the second wiring units Vb of the main power wiring Vdd1 and the second initialization voltage wiring units Vib of the main initialization voltage wiring Vint1 may extend to not only an area adjacent to the transmission area TA, but also an area adjacent to the pixel area PA, obtained by placing the first additional wiring unit Vdd2 and the second additional wiring unit Vint2 across the transmission area TA other than the pixel area PA.

For example, an area through which external light is transmitted may expand to, not only the transmission area TA and the second wiring units Vb and Vib adjacent to the transmission area TA, but also an area B adjacent to the pixel area PA. Thus, transmittance of the organic light emitting display apparatus may be further improved.

The data wirings D1, D2, and D3 are adjacent to the pixel area PA and the transmission area TA, and may include the first wiring unit Da including the mother wiring Dm adjacent to the pixel area PA and having the first width L1D. The second wiring unit Db includes the branched wirings Db1, Db2, and Db3 which are branched from the mother wiring Dm and which are adjacent to the transmission area TA.

The second wiring unit Db of the data wirings D1, D2, and D3 may extend to, not only the area adjacent to the transmission area TA, but also the area adjacent to the pixel area PA, obtained by placing the first additional wiring unit Vdd2 and the second additional wiring unit Vint2 across the transmission area TA other than the pixel area PA.

For example, the area through which external light is transmitted may expand to, not only the transmission area TA and the second wiring unit Db adjacent to the transmission area TA, but also an area A adjacent to the pixel area PA. Thus, transmittance of the organic light emitting display apparatus may be further improved.

Figure 9:
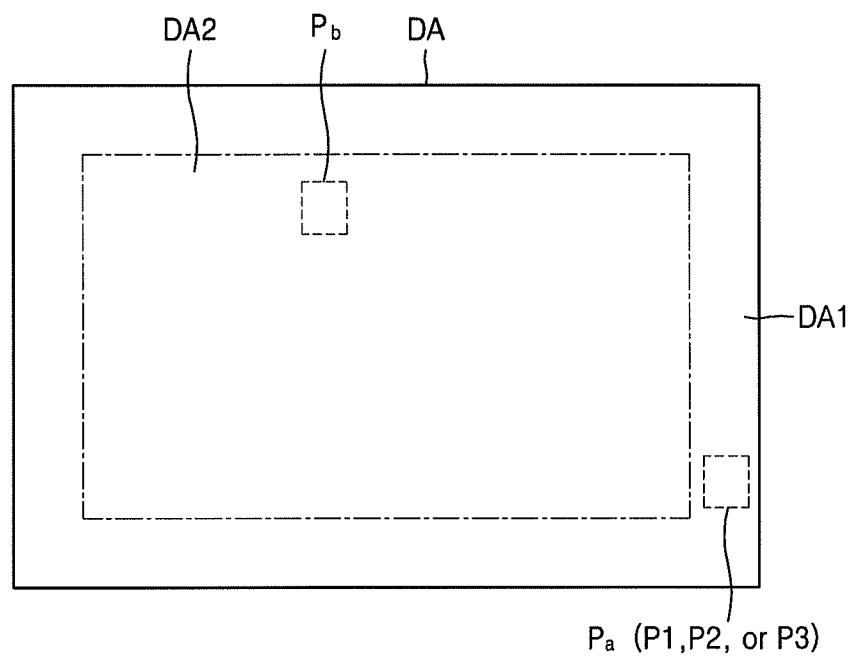
FIG. 9 illustrates an embodiment of a display area.
Figure 10:
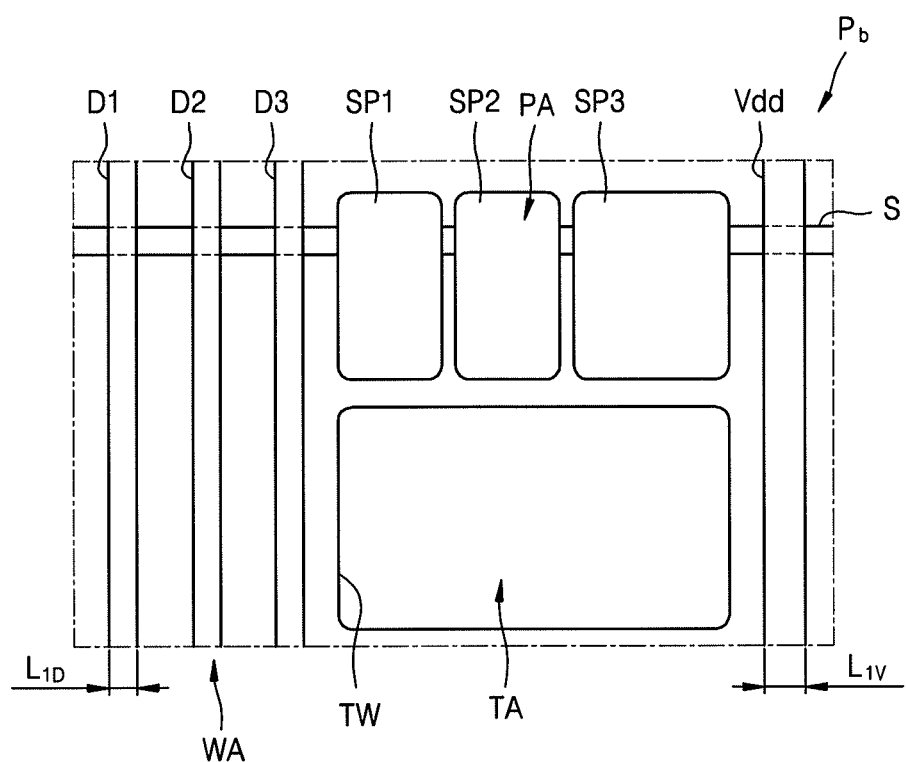
FIG. 10 illustrates another embodiment of a pixel.

FIG. 9 illustrates an embodiment of a display area DA of an organic light-emitting display apparatus. FIG. 10 illustrates an embodiment of a pixel Pb of FIG. 9.

Referring to FIGS. 9 and 10, the display area DA includes a first display area DA1 and a second display area DA2. The first display area has a plurality of pixels Pa, each of which includes a pixel area PA (FIGS. 2, 7, and 8) for emitting light and a transmission area TA (FIGS. 2, 7, and 8) for transmitting external light. The second display area DA2 has a plurality of pixels Pb, each of which includes a pixel area PA (FIG. 10) for emitting light and a transmission area TA (FIG. 10) for transmitting external light.

Each of the pixels Pa in the first display area DA1 may include the data wirings D1, D2, D3 and power wiring Vdd, including first wiring units Da and Va which include mother wirings Dm and Vm adjacent to the pixel area PA and second wiring units Db and Vb including branched wirings Db1, Db2, Db3, Vb1, Vb2 and Vb3 adjacent to the transmission area TA, for example, as shown in FIG. 2, 7, or 8. The pixel Pa in the first display area DA1 may have a high transmittance compared, for example, to a case where wirings have uniform widths.

Each of the pixels Pb in the second display area DA2 may include a pixel area PA for emitting light, a transmission area TA for transmitting external light, and a wiring area WA including various wirings. The pixel area PA may include the first through third emission units SP1, SP2, and SP3 that emit light of different colors, and may form a white light based on a combination of the emitted colors. The transmission area TA may be adjacent to the first through third emission units SP1, SP2, and SP3. External light may be recognized by a user after being transmitted through the transmission area TA of the organic light-emitting display apparatus.

The scan wiring S, the data wirings D1, D2, and D3, and the power wiring Vdd may be in the wiring area WA. The scan wiring S may extend in a first direction across the pixel area PA and may have generally a uniform width. The data wirings D1, D2, and D3 and the power wiring Vdd may extend in a second direction across the first direction to be adjacent to the pixel area PA and the transmission area TA, and also may have generally uniform widths.

The first display area DA1 may have a higher transmittance than that of the second display area DA2. The first display area DA1 and the second display area DA2 may be connected to each other to configure one screen. For example, a part required to transfer information by forming an image in a display apparatus (such as a watch) may be configured as the pixel Pb in the second display area DA2, and a part requiring a high transmittance may be configured as the pixels Pa in the first display area DA1. As a result, the functionality and aesthetics of the display apparatus may be simultaneously improved.

The display area DA has a predetermined (e.g., rectangular) shape, and the first display area DA1 may surround the second display area DA2 in FIG. 9, but this may not be the case for all embodiments. For example, the display area DA may have, for example, a circular shape and may be disposed in various ways with respect to the first display area DA1 and the second display area DA2.

In accordance with one or more of the aforementioned embodiments, a see-through organic light-emitting display apparatus is provided which has improved transmittance and which, at the same time, does not reduce an opening ratio.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. An organic light-emitting display apparatus having a pixel area to emit light and a transmission area to transmit external light, the organic light-emitting display apparatus comprising:
    a substrate;
    a scan wiring disposed on the substrate, the scan wiring extending in a first direction across the pixel area;
    a data wiring and a power wiring insulated from the scan wiring, the data wiring and a power wiring extending in a second direction across the first direction, the data wiring and the power wiring adjacent to the pixel area and the transmission area;
    a switching transistor in the pixel area and connected to the scan wiring and the data wiring;
    a driving transistor in the pixel area and connected to the switching transistor and the power wiring; and
    an organic light-emitting device in the pixel area and connected to the driving transistor, wherein at least one of the data wiring or the power wiring includes:
    a first wiring adjacent to the pixel area and including a mother wiring having a first width, and
    a second wiring including a plurality of branched wirings which branch from the mother wiring, the branched wirings adjacent to the transmission area and not overlapping the transmission area, wherein a width of each of the branched wirings is less than the first width and wherein the mother wiring and the branched wirings extend in a same direction.

2. The apparatus as claimed in claim 1, wherein a sum of the widths of the branched wirings is substantially equal to or greater than the first width.

3. The apparatus as claimed in claim 1, wherein the widths of the branched wirings are substantially equal to each other.

4. The apparatus as claimed in claim 1, wherein the width of each of the branched wirings is less than 10 μm.

5. The apparatus as claimed in claim 1, wherein the power wiring includes a first additional wiring extending in the first direction and having a mesh structure.

6. The apparatus as claimed in claim 5, wherein the first additional wiring includes a plurality of wirings which extend across the transmission area, which are connected to each other, and which have widths less than the first width.

7. The apparatus as claimed in claim 1, further comprising:
    an initialization voltage wiring to initialize a voltage applied to an electrode of the driving transistor, the initialization voltage wiring extending in the second direction and being adjacent to the pixel area and the transmission area.

8. The apparatus as claimed in claim 7, wherein the initialization voltage wiring including:
    a first initialization voltage wiring adjacent to the pixel area and including a mother wiring having a second width, and
    a second initialization voltage wiring including a plurality of branched wirings which branch from the mother wiring having the second width and which are adjacent to the transmission area, wherein each of the branched wirings in the second initialization voltage wiring has a width less than the second width.

9. The apparatus as claimed in claim 8, wherein the initialization voltage wiring includes a second additional wiring extending in the first direction and having a mesh structure.

10. The apparatus as claimed in claim 9, wherein the second additional wiring includes a plurality of wirings which extend across the transmission area, which are connected to each other, and which have widths less than the second width.

11. The apparatus as claimed in claim 1, wherein each of the scan wiring, the data wiring, and the power wiring includes at least one of titanium (Ti), molybdenum (Mo), aluminum (Al), or copper (Cu).

12. The apparatus as claimed in claim 1, wherein the pixel area includes:
    a first emission area, a second emission area, and a third emission area to emit light of different colors, wherein the transmission area is adjacent to the first emission area, the second emission area, and the third emission area.

13. The apparatus as claimed in claim 1, wherein the organic light emitting device includes:
    a pixel electrode connected to the driving transistor;
    an opposite electrode facing the pixel electrode; and
    an intermediate layer between the pixel electrode and the opposite electrode and including an organic emission layer to emits light, wherein the switching transistor and the driving transistor overlap the pixel electrode.

14. The apparatus as claimed in claim 13, further comprising:
    a pixel defining film covering at least a part of the pixel electrode,
    wherein the pixel defining film includes an opening in the transmission area.

15. An organic light-emitting display apparatus, comprising:
- a first display area and a second display area, each of the first and second display areas including a plurality of pixels, each of the pixels having a pixel area to emit light and a transmission area to transmit external light, the pixel including:
- a scan wiring extending in a first direction across the pixel area;
- a data wiring and a power wiring insulated from the scan wiring, the data wiring and a power wiring extending in a second direction across the first direction, the data wiring and the power wiring being adjacent to the pixel area and the transmission area,
- a switching transistor in the pixel area and connected to the scan wiring and the data wiring,
- a driving transistor in the pixel area and connected to the switching transistor and the power wiring, and
- an organic light-emitting device in the pixel area and connected to the driving transistor, wherein:
- at least one of the data wiring or the power wiring in each of the pixels in the first display area includes a first wiring adjacent to the pixel area and a mother wiring having a first width, and a second wiring including a plurality of branched wirings which branch from the mother wiring and which are adjacent to the transmission area and do not overlap the transmission area, the mother wiring and the branched wirings extending in a same direction,
- a width of each of the branched wirings is less than the first width, and
- the data wiring and the power wiring in the pixels in the second display area have substantially uniform widths.

16. The apparatus as claimed in claim 15, wherein transmittance of the first display area is greater than transmittance of the second display area.

17. The apparatus as claimed in claim 15, wherein the first display area and the second display area are connected to each other to form one screen.

18. The apparatus as claimed in claim 15, wherein the first display area surrounds the second display area.

19. The apparatus as claimed in claim 15, wherein a sum of widths of the branched wirings is substantially equal to or greater than the first width.

20. The apparatus as claimed in claim 15, wherein widths of the branched wirings are substantially equal to each other.

21. The apparatus as claimed in claim 15, wherein the width of each of the branched wirings is less than 10 μm.

22. The apparatus as claimed in claim 15, wherein the scan wiring, the data wiring, and the power wiring include at least one of titanium (Ti), molybdenum (Mo), aluminum (Al), or copper (Cu).

23. An organic light-emitting display apparatus having a pixel area to emit light and a transmission area to transmit external light, the organic light-emitting display apparatus comprising:
- a substrate;
- a scan wiring disposed on the substrate, the scan wiring extending in a first direction across the pixel area;
- a data wiring and a power wiring insulated from the scan wiring, the data wiring and a power wiring extending in a second direction across the first direction, the data wiring and the power wiring adjacent to the pixel area and the transmission area;
- a switching transistor in the pixel area and connected to the scan wiring and the data wiring;
- a driving transistor in the pixel area and connected to the switching transistor and the power wiring; and
- an organic light-emitting device in the pixel area and including a pixel electrode connected to the driving transistor, an opposite electrode facing the pixel electrode and an intermediate layer between the pixel electrode and the opposite electrode, and
- a pixel defining film covering at least a part of the pixel electrode,
- wherein at least one of the data wiring or the power wiring includes:
- a first wiring adjacent to the pixel area and including a mother wiring having a first width, and
- a second wiring including a plurality of branched wirings which branch from the mother wiring, the branched wirings adjacent to the transmission area and not overlapping the transmission area, wherein a width of each of the branched wirings is less than the first width and wherein the mother wiring and the branched wirings extend in a same direction, and
- wherein the pixel defining film includes a first opening in the pixel area and a second opening in the transmission area.

* * * * *